United States Patent [19]
van Hattum et al.

[11] 4,162,433
[45] Jul. 24, 1979

[54] CIRCUIT ARRANGEMENT INCLUDING A LINE DEFLECTION CIRCUIT

[75] Inventors: Johannes S. A. van Hattum; Engelbertus S. P. van Veen; Wilhelmus M. Dorn, all of Eindhoven, Netherlands

[73] Assignee: U.S. Philips Corporation, New York, N.Y.

[21] Appl. No.: 816,958

[22] Filed: Jul. 19, 1977

Related U.S. Application Data

[63] Continuation of Ser. No. 670,875, Mar. 26, 1976, abandoned, which is a continuation of Ser. No. 473,771, May 28, 1974, abandoned.

[51] Int. Cl.² ............................................. H01J 29/70
[52] U.S. Cl. ..................................... 315/411; 315/408
[58] Field of Search ............... 315/399, 400, 405, 407, 315/408, 409, 410, 411; 336/178

[56] References Cited

U.S. PATENT DOCUMENTS

| | | | |
|---|---|---|---|
| 1,624,536 | 4/1927 | Christopher | 336/178 |
| 3,209,293 | 9/1965 | Cornell | 336/178 |
| 3,433,998 | 3/1969 | Wolber | 315/400 X |
| 3,434,003 | 3/1969 | Geller | 315/400 |
| 3,769,542 | 10/1973 | Pieters | 315/399 |
| 3,868,538 | 8/1975 | Blanchard | 315/411 |
| 3,912,971 | 10/1975 | Houkes | 315/408 |
| 4,079,295 | 3/1978 | Den Hollander | 315/411 |

OTHER PUBLICATIONS

Wessel, P. L., A New Horizontal Output Deflection Ckt. IEEE Transactions on Broadcast and TV Receivers, vol. BTR. 18, No. 3.

Primary Examiner—Theodore M. Blum
Attorney, Agent, or Firm—Thomas A. Briody; William J. Streeter

[57] ABSTRACT

A circuit arrangement for combined line deflection and supply voltage stabilization. An EHT winding is wound on the same core as the switched-mode transformer in spite of the fact that different waveforms are present on the various windings of the transformer.

16 Claims, 12 Drawing Figures

CIRCUIT ARRANGEMENT INCLUDING A LINE DEFLECTION CIRCUIT

This is a continuation of Ser. No. 670,875 filed Mar. 26, 1976 which is a continuation of Ser. No. 473,771 filed May 28, 1974 both now abandoned.

The invention relates to a circuit arrangement including a line deflection circuit for generating a line frequency sawtooth-shaped deflection current through a line deflection coil in television display apparatus, and with a voltage supply circuit switching at the line frequency, in which the line deflection circuit comprises the deflection coil, a trace capacitor, a retrace capacitor, a first line frequency controllable switch and at least a winding on a transformer with a core of magnetic material and in which the voltage supply circuit comprises a winding of an inductive element coupled through a diode to the line deflection circuit, said winding being coupled to a voltage supply source by means of a second controllable switch.

Such a circuit arrangement is described in the publication "IEEE Transactions on Broadcast and Television Receivers", August 1972, vol. BRT-18, no 3, pages 177 to 182 and is the combination of a line deflection circuit and a switched voltage supply stabilising circuit in which the controllable switch serves for fulfilling both these functions. This known circuit arrangement has the advantage that it can be fed by an unstabilized supply voltage and can produce a satisfactorily stabilized deflection current and a stabilized high voltage (EHT) and possibly auxiliary voltages, which stabilization is obtained by controlling the duty cycle of the switch.

The said publication states that an EHT winding may be coupled with the winding of the inductive element on which EHT winding pulses of high amplitude are produced during the retrace time. These pulses are applied to a rectifier for generating the EHT for the acceleration anode of the television display tube. A drawback of such a step is that the inductive element must be able to accumulate considerable power which requires a high inductance for this element so that it becomes expensive.

Another drawback is the following. In practice, the inductive element will often have two windings namely a primary winding which is incorporated between a terminal of a voltage supply source and the connection point of the switch (a transistor) and the second diode, and a secondary winding which is coupled to the deflection network through the third diode. During the part of the trace time when the transistor does not conduct, the third diode does conduct. The EHT winding is thus coupled to the secondary winding of the inductive element. During the other part of the trace time the transistor conducts and the third diode does not so that the EHT winding is thus coupled to the primary winding of the inductive element. Since the leakage inductance between the EHT winding and the primary winding and that between the said EHT winding and the secondary winding are necessarily different for reasons of winding and assembly technique, the series resonant frequency of the network constituted by the leakage inductance and the capacitance to ground is different during the said two parts of the trace time. As a result a higher harmonic tuning of the inductive element to be considered as an EHT transformer is impossible so that parasitic oscillations may be produced.

A further drawback of the described step is that the voltage across the two windings of the inductive element varies stepwise at the instant when the transistor is rendered conducting. The above-mentioned series resonant network is thereby excited which may give rise to parasitic oscillations after the said instant. In addition, this instant, which is dependent on the supply voltage, is variable.

The said drawbacks may be eliminated if the EHT winding is coupled to a winding which is either coupled directly or through a capacitor to the deflection network. This step is also stated in the said publication (FIG. 8, page 181). During the entire trace time a current flows through this winding so that the leakage inductance therebetween and between the EHT winding does not vary, whilst the voltage thereacross does not change stepwise. This step has, however, the clear drawback that the circuit arrangement not only include the inductive element but also an extra transformer which must be able to pass on a considerable power, in colour television in the order of a maximum of 25 kV × 2 mA = 50W EHT power and which is therefore an expensive component.

The object of the invention is to have an economy in these expensive components and to this end the circuit arrangement according to the invention is characterized in that the winding of the inductive element is also wound on the said core.

The invention is based on the recognition of the following fact. A voltage which undergoes for example the following variation is present across each winding of the inductive element: during the retrace time, this voltage is proportional to the retrace pulse, during the part of the trace time when the transistor does not conduct it assumes a given value and during the rest of the trace time it assumes a different value. On the other hand, a voltage which is equal to the retrace pulse during the retrace time and substantially does not vary during the entire trace time is present across the transformer winding coupled to the deflection network. When the transformer winding and the inductive element are according to the invention coupled together, currents flow through them which are caused by the coupling and which are dependent inter alia on the difference between the voltage across the transformer winding and that across the inductive element but which do not influence these voltages so that voltages of different shapes remain present across the coupled windings. It is found that these currents not only result in substantially no increase of the losses but that they have no detrimental influence in case of a suitable chosen design of the arrangement because the operation of the arrangement remains unchanged in spite of the fact that one of these extra currents through the third diode flows in the blocking direction and therefore might bring this diode in the blocked condition.

Due to the step according to the invention, on the contrary, important advantages are achieved. In the known arrangement, a given minimum power is to be dissipated for its satisfactory operation. It is found that in the arrangement according to the invention this minimum can be considerably reduced so that the theoretical situation is approximated where it does not substantially derive any energy from the voltage supply source whilst there are no losses in the arrangement. This can be obtained by suitable choice of two of the parameters determining the arrangement, namely the coupling factor and the transformation ratio between a winding of the inductive element and the transformer winding. Due to the choice of the same parameters the maximum intensity of the current flowing through the transistor, i.e. at the end of the trace time, and the premagnetisation of the core can be reduced. A compromise can be found in which all requirements can be satisfied in a reasonable way.

If the circuit arrangement is formed as in the above-mentioned publication, in which the second switch is constituted by a transistor, it is characterised in that the first switch includes a second diode through which the deflection current flows during part of the trace time and the series arrangement of said transistor and a third diode through which series arrangement the deflection current flows during the other part of the trace time. Other embodiments are, however, possible which are slightly different from the above-mentioned one but which nevertheless are within the scope of this invention in which embodiments no retrace pulses but square-wave voltages are present across the windings of the inductive element.

The invention also relates to an EHT transformer which is characterized by a core of magnetic material having a first and a second leg, in which two windings are wound with a tight coupling on the first leg and at least one further winding and an EHT winding on the second leg.

The invention will be described in greater detail by way of example with reference to the accompanying Figures in which.

Figure 1:
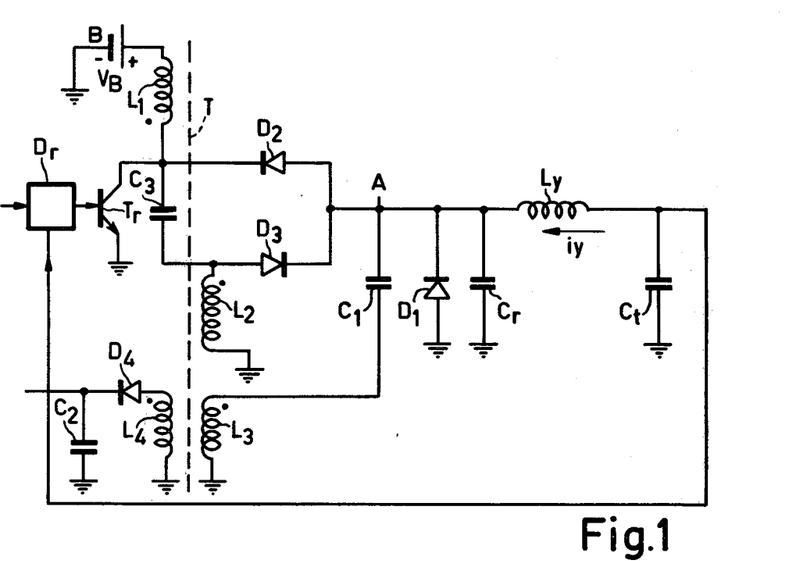
FIG. 1 shows the principle circuit diagram of a first embodiment of the arrangement according to the invention.

The circuit arrangement of FIG. 1 includes a driver stage Dr which receives signals from a line oscillator not shown and which applies switching pulses to the base of a switching transistor Tr. One end of a primary winding $L_1$ of a transformer T is connected to the collector of transistor Tr which is of the npn type while the other end of winding $L_1$ is connected to the positive terminal of a direct voltage source B and the emitter of transistor Tr is connected to the negative terminal thereof. This negative terminal may be connected to ground of the circuit arrangement.

A trace capacitor $C_t$ is arranged in series with the line deflection coil $L_y$ of the circuit arrangement of FIG. 1 in the television display apparatus (not shown) and a diode $D_1$ with the indicated conductivity direction and a retrace capacitor $C_r$ are arranged in parallel with the series arrangement thus constituted. Capacitor $C_r$ may alternatively be arranged in parallel across coil $L_y$. The four elements only show the principle circuit diagram with the main components of the deflection section. This section may be provided, for example, in known manner with one or more transformers for mutual coupling of the elements, with arrangements for centering and linearity correction and the like.

A secondary winding $L_2$ of transformer T is arranged in series with a diode $D_3$ whose cathode is connected to the junction A of elements $D_1$, $C_r$ and $L_y$ and to the anode of a diode $D_2$. The cathode of diode $D_2$ is connected to the collector of transistor Tr. A tertiary winding $L_3$ of transformer T is connected through a capacitor $C_1$ to point A. Other windings are wound on the core of transformer T across which windings there are voltages which serve as supply voltages for other parts of the television display apparatus. One of these windings, winding $L_4$, is shown in FIG. 1 and generates with the aid of a rectifier $D_4$ a positive direct voltage across a smoothing capacitance $C_2$. One of these windings, for example, winding $L_4$, is the EHT winding so that the voltage across capacitance $C_2$ is the EHT for the acceleration anode of the display tube (not shown). The free ends of windings $L_2$, $L_3$ and $L_4$ are connected to ground and the winding sense of the windings shown of transformer T is denoted by polarity dots in the Figure.

When, firstly, the fact is not taken into account that winding $L_3$ is coupled to the inductive element $L_1$, $L_2$ of the known arrangement, the described circuit arrangement operates likewise as that of the above-mentioned publication which may be summarised as follows. During a first part of the line trace time diode $D_1$ conducts. The voltage across capacitor $C_t$ is set up at deflection coil $L_y$ through which a sawtooth deflection current $i_y$ flows. At a given instant transistor Tr becomes conducting. When approximately in the middle of the trace time current $i_y$ reverses its direction, diode $D_1$ is blocked so that current $i_y$ then flows through diode $D_2$ and transistor Tr. At the end of the trace time, transistor Tr is cut off. An oscillation, the retrace pulse, is produced across capacitor $C_r$ while the energy stored in winding $L_1$ and derived from source B produces a current through diode $D_3$. When the voltage across capacitor $C_r$ has become zero again, diode $D_1$ becomes conducting: this is the commencement of a new trace time. Diode $D_3$ remains conducting until transistor Tr is rendered conducting in which the energy in winding $L_2$ is passed on to winding $L_1$. Stabilization is provided in that, for example, the voltage across capacitor $C_t$ is fed back to driver circuit Dr in which a comparison stage an a modulator insure that the conductivity time of transistor Tr is varied in such a manner that the said voltage and consequently the amplitude of the deflection current remain constant.

Figure 2:
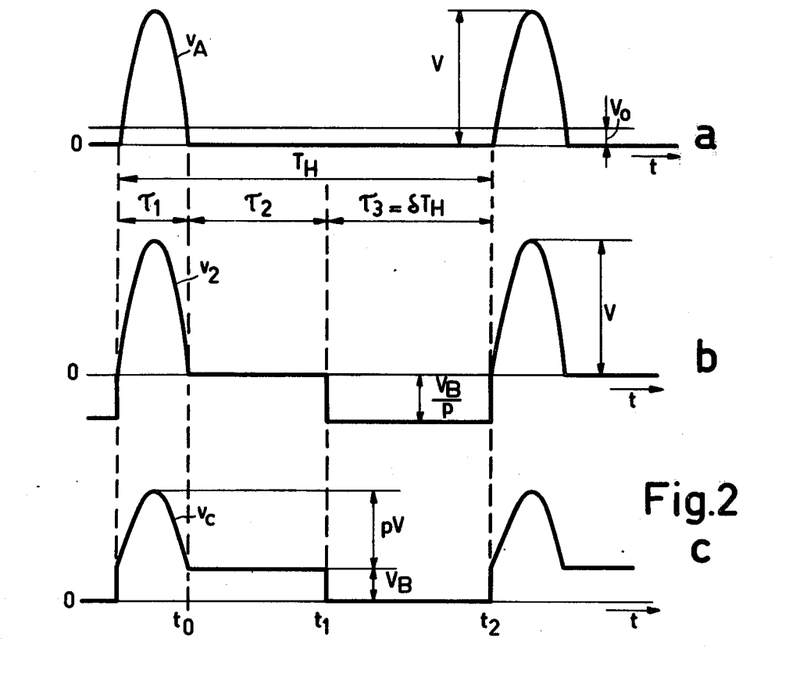
FIG. 2 shows waveforms occurring therein.

In FIG. 2a the voltage $v_A$ across capacitor $C_r$, in FIG. 2b the voltage $v_2$ at the junction of winding $L_2$ and diode $D_3$ and in FIG. 2c the voltage $v_c$ at the collector of transistor Tr are plotted as a function of time. The symbol $T_H$ indicates the line period while $\tau_1$ indicates the retrace time, $\tau_2$ the part of the period $T_H$ when transistor Tr does not conduct and $\tau_3 = \delta T_H$ the part of the period $T_H$ in which the transistor does conduct. The number $\delta$ is the ratio between time $\tau_3$ and period $T_H$.

During the times $\tau_1$ and $\tau_2$ diode $D_3$ conducts and voltages $v_A$ and $v_2$ are equal, i.e. the retrace pulse with amplitude V during the time $\tau_1$ and zero during the time $\tau_2$. At the instant when transistor Tr is rendered conducting i.e. the transition instant $t_1$ between $\tau_2$ and $\tau_3$, voltage $v_C$ becomes substantially zero. The voltage $V_B$ from source B is then produced across winding $L_1$. If the transformation ratio between windings $L_2$ and $L_1$ i.e. the ratio between the number of turns of winding $L_2$ and that of winding $L_1$ is equal to 1:p, voltage $v_2$ is equal to $-V_B/p$ during the time $\tau_3$. Voltage $v_C$ is equal to $pV_2+V_B$ during the time $\tau_1$.

When $V_o$ is the direct voltage across capacitor $C_t$, if it has a sufficiently large capacitance, or when it is the direct voltage component of the voltage across this capacitor if it has a comparatively low capacitance for the so-called S correction, $V_o$ is equal to the mean value of voltage $v_A$. In fact, a direct voltage component cannot be present across coil $L_y$. There applies that:

$$V_o = \frac{1}{T_H} \int_0^{\tau^1} v_A dt.$$

The mean value of the voltage across winding $L_2$ is also zero so that there applies that:

$$\int_0^{\tau^1} v_A dt - \frac{V_B}{p} \cdot \tau_3 = 0.$$

In this formula, the integral can be filled in so that $$V_o T_H = \frac{V_B}{p} \cdot \tau_3, \text{ i.e. } V_o = \frac{\delta \cdot V_B}{p} \quad (1)$$

At given values of ratios $\delta$ and p, diode $D_2$ would conduct during the time $\tau_1$. Since diode $D_3$ conducts during the same period, windings $L_1$ and $L_2$ would be shortcircuited by diodes $D_2$ and $D_3$ so that the retrace pulse across capacitor $C_r$ would be cut off and the deflection current would be distorted. In U.S. Pat. No. 3,912,971 steps have been described with which such an effect is obviated, for example, the provision of a transistor cut off during the time $\tau_1$ in series with diode $D_2$. A capacitor $C_3$ is arranged between the ends of windings $L_1$ and $L_2$ or taps thereof and this capacitor has for its purpose to prevent parasitic oscillations which might be caused by the leakage inductance present between the said windings and this in such a manner that no line frequency voltage is present across capacitor $C_3$. FIG. 1 shows the case where $p=1$.

Similarly as regards capacitor $C_t$ it may be evident that a direct voltage or a direct voltage component is present across capacitor $C_1$ which is equal to voltage $V_o$ so that the voltage across winding $L_3$ is substantially equal in shape to that of FIG. 2a with the difference that the zero axis must be shifted upwards with a value equal to voltage $V_o$. The invention is based on the recognition of the fact that windings $L_1$ and $L_2$ on the one hand and winding $L_3$ on the other hand may be coupled together as is the case in FIG. 1, in spite of the fact that voltages of different shapes are present across the said windings, and that these voltage shapes are not influenced by the coupling. Coupling of the windings of transformer T cannot influence the "hard" voltages $V_o$ and $V_B$, that is to say, voltages externally impressed. However, the currents flowing through the different windings are influenced.

Figure 3:
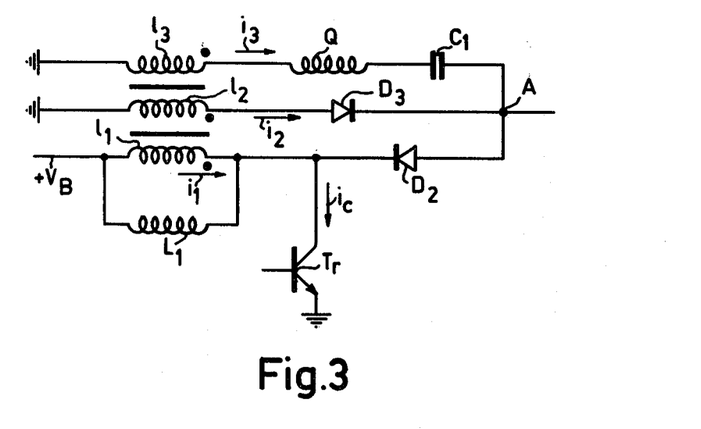
FIG. 3 shows an equivalent circuit diagram of part of the arrangement according to FIG. 1.

FIG. 3 shows an equivalent circuit diagram of a part of FIG. 1. As in the mentioned publication, the coupling between windings $L_1$ and $L_2$ is very tight. Thanks to the presence of capacitor $C_3$ the coupling factor between these windings may be considered to be equal to 1. The coupling factor between windings $L_2$ and $L_3$ is not equal to 1 so that only a part of the tertiary winding is coupled to the secondary winding where the coupling factor is equal to 1 and is in series with an inductor Q not coupled to the secondary winding which inductor represents the leakage inductance between windings $L_2$ and $L_3$. Thus, the equivalent circuit diagram comprises three windings $l_1$, $l_2$ and $l_3$ mutually having a coupling factor of 1 and with the transformation ratio of $l_1$ to $l_2$ equal to the above-mentioned ratio p and of $l_3$ to $l_2$ equal to a number n. An inductor having a value of $L_1$ is arranged in parallel across winding $l_1$ which value is equal to the value measured across winding $L_1$ in FIG. 1 without a load across the other windings. The above-mentioned inductor Q is arranged in series with winding $l_3$ and the inductance $L_3$ is measured across the series arrangement which value is equal to that of winding $L_3$ in FIG. 1 without a load across the other windings. It can be derived that:

$$Q = L_3 - n^2 L_1 = L_3(1-k^2)$$

and $$k = n\sqrt{L_1/L_3},$$

in which k is the coupling factor between windings $L_2$ and $L_3$ in FIG. 1.

Without this coupling ($k=0$) the respective currents $i_{10}$, $i_{20}$ and $i_{30}$ flow through windings $L_1$, $L_2$ and $L_3$ in which currents $i_{10}$ and $i_{20}$ are those of the quoted publication and in which current $i_{30}$, likewise as current $i_y$, is sawtooth-shaped. Since windings $L_2$ and $L_3$ are coupled together, extra currents $i_{1k}$, $i_{2k}$ and $i_{3k}$ flow through the respective windings. When it is assumed that the arrangement comprises ideal inductors, capacitors and semiconductors, these extra currents do not cause any increase in losses. In practice, this increase will remain small. In addition, the above-defined parameters n and k may be chosen to be such that the operation of the arrangement is not detrimentally influenced which will be explained hereinafter.

The respective currents $i_1 = i_{10} + i_{1k}$, $i_2 = i_{20} + i_{2k}$ and $i_3 = i_{30} + i_{3k}$ flow through the windings $l_1$, $l_2$ and $l_3$ of FIG. 3. The following can be shown.

During the time $\tau_1$, $i_1 = 0$ and currents $i_2$ and $i_3$ undergo the variations $$\Delta i_2 = -\frac{V_o T_H}{L_1} \cdot \frac{1}{1-k^2}(1 - k^2 \cdot \frac{\tau_2 + \tau_3}{nT_H}) \quad (2)$$

and $$\Delta i_3 = \frac{V_o T_H}{L_1} \cdot \frac{k^2}{1-k^2}(1 - \frac{\tau_2 + \tau_3}{nT_H}).$$

During the time $\tau_2$: $i_1 = 0$ $$\Delta i_2 = -\frac{V_o T_H}{L_1} \cdot \frac{k^2}{1-k^2} \cdot \frac{\tau_2}{nT_H}$$

and $$\Delta i_3 = \frac{V_o T_H}{L_1} \cdot \frac{k^2}{1-k^2} \cdot \frac{\tau_2}{n^2 T_H}.$$

During the time $\tau_3$: $i_2 = 0$ $$\Delta i_1 = \frac{V_o T_H}{pL_1} \cdot \frac{1}{1-k^2}(1 - k^2 \cdot \frac{\tau_3}{nT_H})$$

and $$\Delta i_3 = -\frac{V_o T_H}{nL_1} \cdot \frac{k^2}{1-k^2}(1 - \frac{\tau_3}{nT_H}).$$

In order that the operation of the arrangement is not disturbed, current $i_2$ must always flow in the direction shown as positive in FIG. 3 in spite of the fact that the variation $\Delta i_2$ thereof is always negative in the time $\tau_2$.

FIG. 3 shows that current $i_1$ must therefore also be positive. Since current $i_1$ only flows during the time $\tau_3$ and since the abovementioned relation (2) shows that its variation $\Delta i_1$ may be both positive and negative during that time, the condition which must be satisfied is as follows: when $\Delta i_1 > 0$, $i_1$ must be larger than or equal to zero at instant $t_1$ which is dependent on $\delta$ and consequently on voltage $V_B$; when $\Delta i_1 < 0$, $i_1$ must be larger than or equal to zero at the instant $t_2$ when the trace time ends.

The mean value of current $i_1$ follows from the calculation of the power taken up by the arrangement:

$$W = \frac{1}{T_H} \int_0^{T_H} V_B i_1 dt = \frac{V_B}{pT_H} \int_0^{\tau_3} pi_1 dt = \frac{V_B}{pT_H} \cdot i_o \tau$$

$$\text{in which } i_o = \frac{1}{\tau_3} \int_0^{\tau_3} pi_1 dt =$$

the said mean value transformed to the secondary side.

Filling in formula (1) leads to:

$i_o = W/V_o$ independent of parameter k.

For the lowest possible value $\delta_{min}$ of $\delta$ the above given condition applies:

$p(i_o - \frac{1}{2}\Delta i_1) \leq 0$ with $\Delta i_1 < 0$ from which $WL_1 = (WL_1)_o \cdot R_1$, while for the highest possible value $\delta_{max}$ of $\delta$ there applies that:

$p(i_o + \frac{1}{2}\Delta i_1) \leq 0$ with $\Delta i_1 < 0$ from which $WL_1 = (WL_1)_o \cdot R_2$. In this formula $(WL_1)_o$ is the value of the product $WL_1$ for $k=0$, thus without coupling, and $$R_1 \geq \frac{1}{1-k^2} \left(1 - k^2 \cdot \frac{\delta_{min}}{n}\right)$$

$$R_2 \geq \frac{1}{1-k^2} \left(k^2 \cdot \frac{\delta_{max}}{n} - 1\right).$$

At a retrace ratio of $\tau_1/T_H = 0.2$, $\delta_{max} = 0.8$ (transistor Tr is rendered conducting at the instant of commencement $t_0$ of the trace time) and $\delta_{min} = 0.4$ (instant $t_1$ coincides with the middle of the trace time). With these data the graph of FIG. 4 can be shown in which the coefficients $R_1$ and $R_2$ are plotted as a function of n and with k as a parameter.

Figure 4:
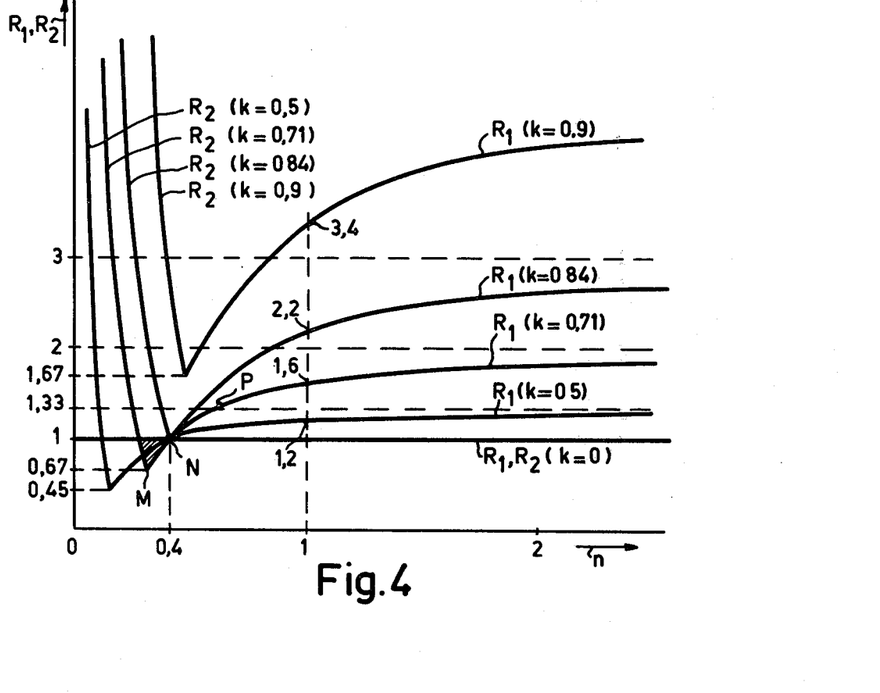
FIG. 4 shows a graph which may serve in the choice of the parameters.

FIG. 4 shows that for a given value of the coupling factor k values for the ratio n can be chosen which are located above the relevant curve of $R_1$ and to the right of the relevant curve of $R_2$. The values which are given by these curves show the minimum value of the ratio of the product $WL_1$ for the said value of factor k and the product $(WL_1)_o$ without a coupling for which the arrangement can operate in a normal manner. It is found that values of the parameters n and k can be chosen in which the said ratio is less than 1. Such a case occurs, for example, with $k=0.71$ and $n \approx 0.3$ in which $R_1 = R_2 = 0.67$ (point M) and, more in general, for $k=0.71$ for the shaded part of the graph. Larger coupling factors are possible: with $k=0.84$ and $n=0.4$, $R_1 = R_2 = 1$ (point N) is obtained which does not result in an improvement, but neither involves a deterioration relative to the case without coupling while the deterioration is small for the case of point P for which $k=0.71$, $n=0.6$ and $R_1 \approx 1.35$. Thus it is found that parameters k and n can be chosen arbitrarily.

Physically, the fact that the minimum dissipated power W for a given $L_1$ (hence for a given quantity of iron and copper) may be smaller than when windings $L_2$ and $L_3$ are not coupled together and with the same $L_1$ can be described as follows. Without a coupling, currents $i_{10}$ and $i_{20}$ always flow in the positive direction so that a certain dissipation is necessary, for example, by losses in deflection coil $L_y$ and/or by a load connected to capacitor $C_t$. With a coupling, extra currents $i_{1k}$ and $i_{2k}$ flow which are produced by energy accumulated in winding $L_3$ and which are induced in windings $L_1$ and $L_2$, which currents may flow in the negative direction without bringing diode $D_3$ in the blocked condition. As a result, part of the energy supplied is fed back to source B again. The foregoing shows that the requirement of the dissipated power being minimum goes together with the requirement that the operation of the arrangement is not influenced by the coupling, that is to say, diode $D_3$ remains conducting in the time $\tau_2$.

Figure 5:
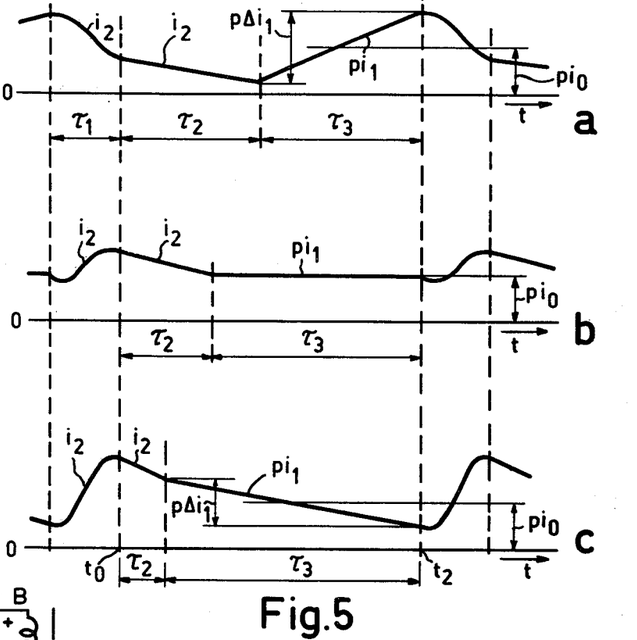
FIG. 5 shows a variation of a current flowing in the arrangement of FIG. 1.

FIG. 5 shows the variation of current $i_2$ during the times $\tau_1$ and $\tau_2$ and of current $pi_1$ during the time $\tau_3$ for different values of the ratio $\delta = \tau_3/T_H$ i.e. for different values of supply voltage $V_B$. In FIG. 5a shows the variation $\Delta i_1$ of formula (2) is positive and in FIG. 5c this variation is negative. Formula (2) shows that for the value of $\delta = n/k^2$ the variation $\Delta i_1$ is zero. Current $pi_1$ then retains the value $pi_o$ during the time $\tau_3$ (FIG. 5b). Since this value which is the same in FIGS. 5a, b and c is proportional to the dissipated power W, it is very low if the power W is low. Since current $i_2$ becomes slightly lower after instant $t_2$ than $pi_o$, $i_o$ cannot be zero but can be very small. This means that the theoretical situation is approximated in which the arrangement does not draw substantially any energy from source B while there are no losses.

Another important consideration relates to the maximum collector current of transistor Tr. At the end $t_2$ of the trace time, current $i_y$ which then flows through diode $D_2$ and transistor Tr assumes its maximum intensity. Also the current through winding $L_1$ and that through winding $L_3$ flow through transistor Tr. During the time $\tau_3$, the collector current $i_c$ is equal to $$i_c = i_y + i_1 + 3 = i_y + (i_{10} + i_{1k}) + (i_{30} + i_{3k})$$
$$= i_y + (i_{10} + i_{30}) + (i_{2k} + i_{3k}) = i_{co} + i_{ck}$$

in which $i_{co}$ and $i_{ck}$ represent the collector current without and with coupling between windings $L_2$ and $L_3$. It can be shown that for a suitable choice of parameters k and n, current $i_{ck}$ becomes zero or even negative at instant $t_2$, so that the collector peak current will have a more favourable value. This resides in the fact that during the trace time the voltage across winding $l_2$ and consequently across winding $l_3$, is square-waved, so that current $i_3$ is sawtooth-shaped. Parameters n and k may be chosen to be such that its intensity at instant $t_2$ is negative but not so much that current $i_c$ becomes zero. In this case, ratio n must not be too small. This is in contrast with the considerations in FIG. 4. This Figure shows, however, that at $n=1$ and $k=0.71$ and $k=0.5$, coefficient $R_1$ is equal to 1.6 and 1.2, respectively, which involves 60% and 20% more minimum power than in the case without coupling. At larger values of n and $k=0.5$, coefficient $R_1$ cannot become larger than 1.33. A satisfactory compromise between the requirement of a low dissipation and that of a lower maximum collector current can thus be found by choosing a low k which is of course not necessary if the maximum collector current at a high k is still far below its admissible peak value.

Another advantage of the step according to the invention is that the magnetizing current of transformer T can be reduced. Without coupling a current which assumes its maximum intensity at instant $t_2$ flows through winding $L_1$. As a result, saturation of the magnetic material constituting the core may occur so that the inductance of winding $L_1$ decreases. The result is that the current flowing therethrough becomes still larger so that the collector dissipation of transistor Tr increases. However, since current $i_c$ can be reduced at instant $t_2$ as a result of this coupling, this means that this saturation occurs to a lesser extent and may not even occur at all. Not only is the transistor safeguarded, but the required inductance of winding $L_1$ can be obtained by fewer turns and/or a core of a smaller cross-section.

EHT winding $L_4$ is more tightly coupled to winding $L_3$ than to windings $L_1$ and $L_2$ which can be realized in practice by using a core which is composed of two U-shaped cores in which windings $L_1$ and $L_2$ are provided on one leg thus formed and windings $L_3$ and $L_4$ are provided on the other leg. Consequently, a voltage is present across winding $L_4$ which does not undergo a sudden change at instant $t_1$. Known winding methods, for example, the so-called higher harmonic tuning method may be used. In the same way, the other windings (not shown) of transformer T may be more tightly coupled to winding $L_3$ than to windings $L_1$ and $L_2$.

Figures 6, 7:
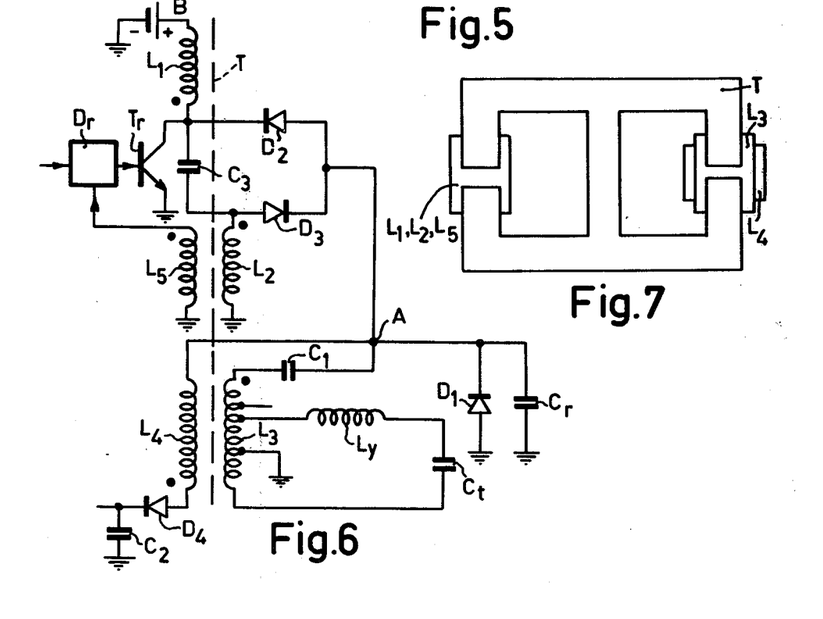
FIG. 6 shows the principle circuit diagram of a second embodiment of the arrangement according to the invention.
FIG. 7 is a sketch of a transformer which may be used in the arrangement according to the invention.

FIG. 6 shows a modification of the arrangement in which the end of EHT winding $L_4$ remote from diode $D_4$ is not connected to ground but to point A. As a result an increase in the voltage to be rectified is obtained. Taps are provided on windings $L_3$ between which the series network $L_y$, $C_t$ is arranged while auxiliary voltages can be derived from other taps. One of these voltages is fed back for stabilization purposes to the modulator present in driver circuit Dr for influencing the time $\tau_3$. Alternatively, an extra winding $L_5$ of transformer T may be used for this purpose.

In one design of transformer T in which a small coupling factor k is chosen, a transformer of small dimensions may be used by using a so-called magnetic shunt. FIG. 7 shows such a construction. It shows that the magnetic flux caused by windings $L_1$ and $L_2$ is mainly present in the left leg and in the central leg, the magnetic shunt, of the core. It may be reduced to an even larger extent in the right-hand leg on which windings $L_3$ and $L_4$ are wound when a sufficient magnetic resistance in this right-hand leg is provided in the form of an air gap. In the same manner, an air gap may also be provided in the left-hand leg.

In one embodiment according to FIG. 1, the number of turns on windings $L_1$, $L_2$ and $L_3$ was 230, 230 and 140, respectively, while inductance $L_1$ was approximately 12 mH and the coupling factor k between windings $L_2$ and $L_3$ was approximately 0.63. The core was formed without a magnetic shunt and with two air gaps each having a width of 0.6 mm. Voltage $V_o$ was stabilized at 140 V at a variation of voltage $V_B$ between 230 and 345 V. The inductance of deflection coil $L_y$ was approximately 1 mH with $C_t \approx 680$ nF and $C_1 \approx 2$ μF. It is clear that the capacitance of capacitor $C_1$ must not be too low because otherwise the voltage across a winding coupled to winding $L_3$ varies parabolically during the trace time and is therefore not usable for trace rectification. In this embodiment the EHT winding was tuned to the fifth harmonic.

A further optimum design of the circuit arrangement according to the invention can be obtained by using air gaps of unequal widths in FIG. 7. When transformer T has equal air gaps, the inductance of windings $L_2$ and $L_3$ are proportioned as the square values of their number of turns. The inductance of $L_2$ is dependent on the minimum dissipated power, while the number of turns on winding $L_3$ is determined by the desired EHT. In case of unequal air gaps the ratio of the inductances is no longer equal to the ratio of the square values of the number of turns, so that a new selectable parameter is available. This parameter can be chosen to be such that the maximum collector current of transistor Tr can be reduced with maintaining the advantages of the step according to the invention. To this end, the widest gap is provided on the left-hand leg on which windings $L_1$ and $L_2$ are wound. The winding $L_5$ across which the voltage is present which is fed back to driver circuit Dr is also provided on the same leg.

Figure 8A:
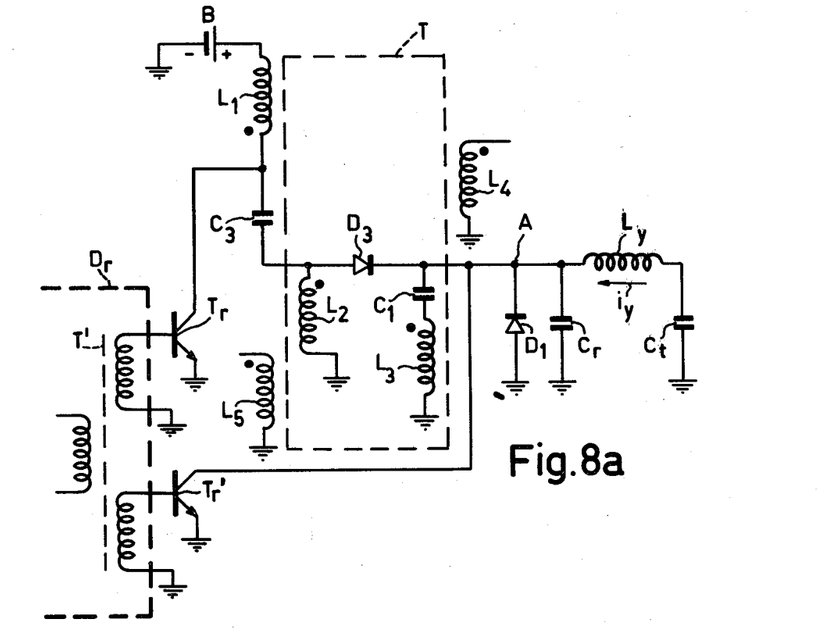
FIGS. 8a and 8b show a third embodiment invention and modification thereof respectively.

The circuit arrangement of FIG. 1 may be replaced in a simple manner by the circuit arrangement shown in FIG. 8a without its properties being changed. The collector-emitter path of a second transistor Tr' is connected in parallel with diode $D_1$ while the base thereof is controlled by driver circuit Dr, for example, by means of a secondary winding of a driver transformer T' another secondary winding of which controls the base of transistor Tr. Transistor Tr' provides a path for deflection current $i_y$ during the second part of the trace time. The fact that the base of transistor Tr' receives a signal during the first half of the trace time, namely at instant $t_1$, is of no importance because current $i_y$ flows through diode $D_1$ anyway. For transistor Tr' a type may be chosen in which the task of diode $D_1$ can be taken over by the collector-base diode of the transistor so that diode $D_1$ may be omitted. Since current $i_y$ no longer flows through diode $D_2$ resulting in this diode remaining blocked during the entire period, it may be omitted too.

Figure 8B:
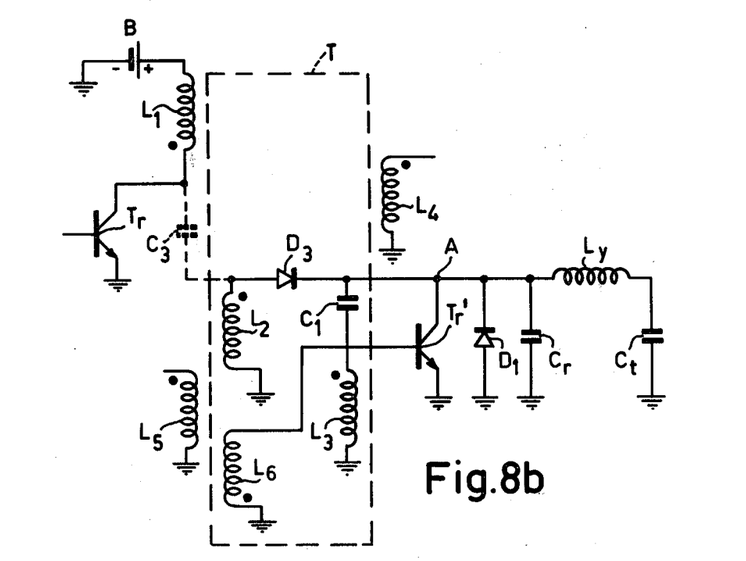

FIG. 8b shows a modification in which transistor Tr' is not controlled by driver circuit Dr which might result in a too high load on this transistor, but by a winding $L_6$ of transformator T. Winding $L_6$ is preferably more tightly coupled to windings $L_1$, $L_2$ and $L_5$ than to windings $L_3$ and $L_4$, for example, windings $L_1$, $L_2$, $L_5$ and $L_6$ being provided on one leg and windings $L_3$ and $L_4$ being provided on the other leg of transformer T, which transformer, dependent on its design, is formed with or without a magnetic shunt (in FIGS. 8a and 8b the core of transformer T is shown as a rectangle for the sake of clarity). Such a construction has the advantage that the deflection section of the arrangement, namely windings $L_2$, $L_3$, $L_4$ and $L_6$ and the components coupled thereto may be separated from the electrical mains while the supply section thereof is not separated. This means, for example, that the dead ends of the said windings and of elements Tr', Cr, Ct, etc . . . are connected to ground while the dead ends of windings $L_1$ and $L_5$ and of elements Tr, B, etc. are connected to the feedback line of the mains. In this case, capacitor $C_3$ (shown in broken lines) must be omitted.

Figure 9A:
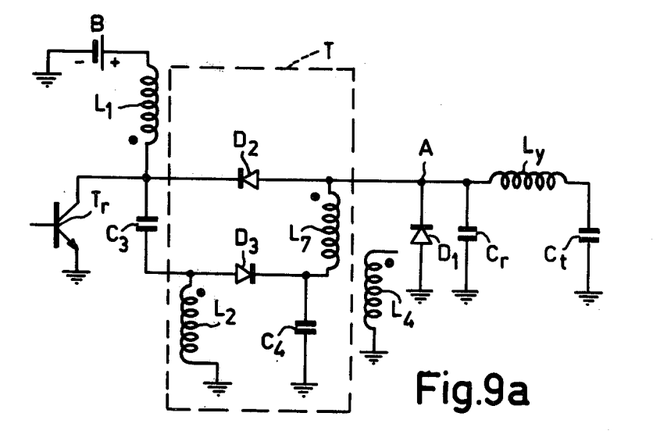
FIGS. 9a 9b and 9c show a fourth embodiment and two modifications thereof respectively.

In the embodiments described, diode $D_3$ is connected to point A. In German Pat. No. 2,130,902 another embodiment is described in which diode $D_3$ is connected to the junction of an inductor and a capacitor while the other connection of the inductor is connected to point A and that of the capacitor is connected to ground. The operation of such an embodiment is roughly the same but a difference is that the waveforms of FIGS. 2b and 2c are replaced by square-waveforms. Since the occurring voltages are also "hard" in such a case, the step according to the invention may be used as is shown in FIG. 9a. The difference between the voltages is, however, larger so that the extra currents produced by the coupling will be larger than in the embodiments described so far which will lead to a different choice of the parameters k and n. In FIG. 9a the said inductor $L_7$ is wound on the core of transformer T while $C_4$ is the said capacitor. Windings $L_1$ and $L_2$ on the one hand, and windings $L_4$ and $L_7$ on the other hand are tightly coupled together.

In the same way as in the embodiment of FIG. 8a, a transistor Tr' in FIG. 9a may be connected in parallel with diode $D_1$ in which the diode itself may be replaced by the collector-base diode of the transistor. This is shown in FIG. 9b in which a winding $L_6$ also wound on the core of transformer T controls the base of transistor Tr'.

Figure 9B:
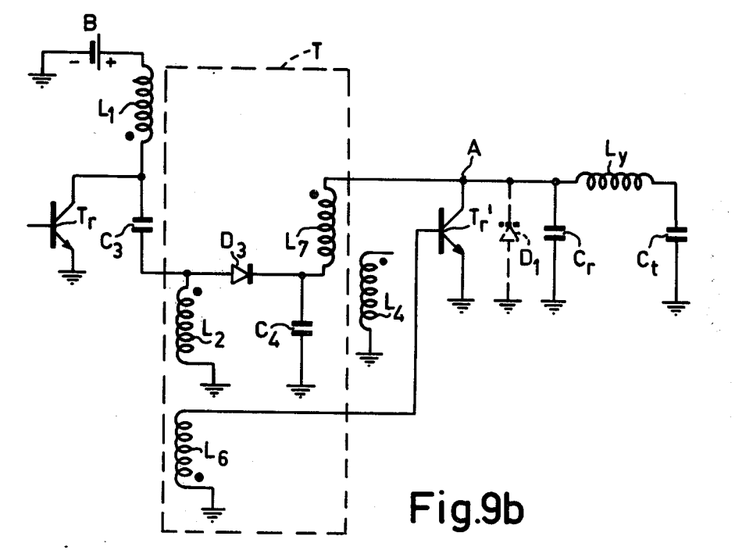
Figure 9C:
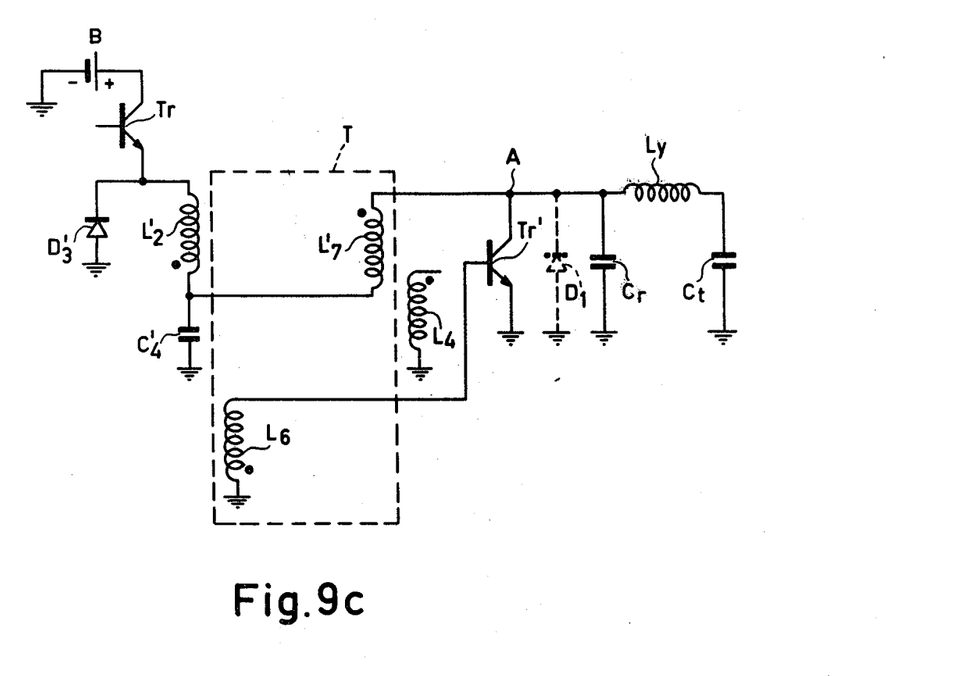

In FIG. 9b, elements Tr, $L_2$, $D_3$ and $C_4$ constitute a voltage supply source of the switched type. A modification thereof is shown in FIG. 9c in which the voltage supply source is constituted by corresponding elements namely Tr, $L'_2$, $D'_3$ and $C'_4$ and is not arranged in parallel but in series with the deflection section to be considered as a load. It is to be noted that when the collector voltage of transistor Tr' becomes too high as a result of a defect in transistor Tr in which the collector-emitter path thereof will form a short circuit, transistor Tr' is still safeguarded because its control voltage has then dropped out.

What is claimed is:

1. A circuit arrangement comprising a line deflection circuit means for generating a line frequency sawtooth-shaped deflection current through a line deflection coil and a voltage supply circuit switching at the line frequency, the line deflection circuit comprising a transformer having a magnetic material core, a trace capacitor coupled to said transformer, a retrace capacitor coupled to said transformer, and a first line frequency-controllable switch coupled to said transformer, the voltage supply circuit comprising a first winding of an inductive element wound on said core, a supply diode coupled between said element and the line deflection circuit and a second controllable switch having a variable duty cycle and coupled to said inductive element and adapted to be coupled to a voltage supply source; a second winding wound on said core, and a third winding means wound on said core for supplying another supply voltage, said third winding means being more tightly coupled to said second winding than to said first winding.

2. A circuit arrangement as claimed in claim 1, further comprising means to reduce the magnetic coupling between said first winding and the remaining two windings.

3. A circuit arrangement as claimed in claim 2, wherein the reducing means comprising the core having a plurality of legs, the winding of the inductive element being wound on a first leg and the second and third windings being wound on a second leg.

4. A circuit arrangement as claimed in claim 3, further comprising modulator means for controlling the duration of line frequency pulsatory signals applied to the second controllable switch, and a fourth winding wound on the first leg and coupled to the modulator.

5. A circuit arrangement as claimed in claim 1, said core of magnetic material having a first leg and a second leg, two windings wound with a tight coupling on the first leg, one of said windings being said inductive element, and said second and third windings being wound on the second leg.

6. A circuit arrangement as claimed in claim 5, wherein the core has three legs, the central leg comprising a magnetic shunt.

7. A circuit arrangement as claimed in claim 5, wherein at least one leg of the core has an air gap.

8. A circuit arrangement as claimed in claim 7, wherein said two legs each have an air gap, the air gap in the first leg being wider than the air gap in the second leg.

9. A circuit arrangement comprising a line deflection circuit means for generating a line frequency sawtooth-shaped deflection current through a line deflection coil and a voltage supply circuit switching at the line frequency, the line deflection circuit comprising a transformer having a magnetic material core, a trace capacitor coupled to said transformer, a retrace capacitor coupled to said transformer, a first diode means for conveying the deflection current during part of the trace time and a series arrangement means coupled to said transformer for conveying the deflection current during the remaining part of the trace time including a line-frequency controllable switch having a variable duty cycle and a second diode series coupled to said switch, the voltage supply circuit comprising an inductive element first winding on said core, a supply diode coupled between said inductive element and said line deflection circuit, the switch being adapted to be coupled through said inductive element to a voltage supply source; a second winding wound on said core, and a third winding means wound on said core for supplying another supply voltage, said third winding means being more tightly coupled to said second winding than to said first winding 10. A circuit arrangement as claimed in claim 9, further comprising means to reduce the magnetic coupling between said first winding and the remaining two windings.

11. A circuit arrangement as claimed in claim 10, wherein the reducing means comprises the core having a plurality of legs, the winding of the inductive element being wound on a first leg and the second and third windings being wound on a second leg.

12. A circuit arrangement as claimed in claim 1, further comprising modulator means for controlling the duration of line frequency pulsatory signals applied to the second controllable switch, and a fourth winding wound on the first leg and coupled to the modulator.

13. A circuit arrangement as claimed in claim 9, said core of magnetic material having a first leg and a second leg, two windings wound with a tight coupling on the first leg, one of said windings being said inductive element, and a deflection winding and an EHT winding are wound on the second leg.

14. A circuit arrangement as claimed in claim 13, wherein the core has three legs, the central leg comprising a magnetic shunt.

15. A circuit arrangement as claimed in claim 13, wherein at least one leg of the core has an air gap.

16. A circuit arrangement as claimed in claim 15, wherein said two legs each have an air gap, the air gap in the first leg being wider than the air gap in the second leg.

* * * * *